United States Patent [19]
Noguchi et al.

[11] Patent Number: 5,243,216
[45] Date of Patent: Sep. 7, 1993

[54] PHOTOTRANSISTOR

[75] Inventors: Shigeru Noguchi; Hiroshi Iwata, both of Osaka; Keiichi Sano, Takatsuki, all of Japan

[73] Assignee: Sanyo Electric Co., Ltd., Moriguchi, Japan

[21] Appl. No.: 839,107

[22] Filed: Feb. 20, 1992

[30] Foreign Application Priority Data

Mar. 4, 1991 [JP] Japan .................... 3-37449

[51] Int. Cl.⁵ .................... H01L 27/14; H01L 31/00
[52] U.S. Cl. .................... 257/462; 257/464; 257/53
[58] Field of Search ............ 357/30 K, 30 J, 2, 16; 257/462, 464, 53

[56] References Cited

U.S. PATENT DOCUMENTS

| 4,496,788 | 1/1985 | Hamakawa et al. | 136/249 |
| 4,498,092 | 2/1985 | Yamazaki | 357/2 |
| 5,055,141 | 10/1991 | Arya et al. | 136/258 |
| 5,066,340 | 11/1991 | Iwamoto et al. | 136/258 |

FOREIGN PATENT DOCUMENTS 2-76266  3/1990  Japan .................... 357/30

*Primary Examiner*—Andrew J. James
*Assistant Examiner*—D. Monin
*Attorney, Agent, or Firm*—W. G. Fasse

[57] ABSTRACT

A phototransistor includes a monocrystalline semiconductor substrate of a first conductivity type, a crystalline semiconductor layer of a second conductivity type formed from a surface of the semiconductor substrate to a predetermined depth, a substantially intrinsic amorphous semiconductor layer formed on the crystalline semiconductor layer, and an amorphous semiconductor layer of the first conductivity type formed on the intrinsic amorphous semiconductor layer.

3 Claims, 3 Drawing Sheets

PHOTOTRANSISTOR

FIELD OF THE INVENTION

The present invention relates to phototransistors, and, more particularly, to improvements in the photosensitivity of a phototransistor with a heterojunction between a monocrystalline semiconductor and an amorphous semiconductor.

BACKGROUND INFORMATION

A phototransistor is generally formed utilizing a process of manufacturing semiconductor devices, on a monocrystalline semiconductor substrate, and a light signal processing circuit including normal transistors and so forth is also formed on the semiconductor substrate at the same time in addition to the phototransistor. Accordingly, it is possible to sense even a very small quantity of light with a high sensitivity by an amplification function of the signal processing circuit.

The step of forming a semiconductor junction is a particularly important step in a manufacturing process of a phototransistor. The semiconductor junction can be formed by doping conductivity type determining impurities from a surface of a monocrystalline semiconductor substrate into the junction. A thermal diffusion method is generally used as a specific method of doping the impurities into the junction.

However, according to the thermal diffusion method, a semiconductor junction plane is formed in a part at a relatively large depth from the surface of the monocrystalline semiconductor substrate, and that depth lowers the photosensitivity of the phototransistor for light having a shorter wavelength which is absorbed mainly in a part at a smaller depth. Therefore, in recent years, consideration has been given to a method of forming a semiconductor junction by depositing an amorphous semiconductor thin film on a monocrystalline semiconductor substrate as a method by which it is possible to control the position of a semiconductor junction plane on the order of Å. However, a semiconductor junction between a monocrystalline semiconductor substrate and an amorphous semiconductor film becomes a so-called heterojunction. The interface characteristics of a heterjunction are generally inferior as compared with the interface characteristics of a conventional homo-junction formed inside a monocrystalline semiconductor substrate by the thermal diffusion method. The reason for this mainly exists in interface energy levels of the heterojunction, which are due to a number of localized energy levels existing in an energy bandgap of an amorphous semiconductor film.

When a number of interface energy levels exist, even if many charge carriers are generated in the vicinity of the heterojunction interface by light irradiation, the interface energy levels function as a recombination center of the carriers and cause part of the carrier to disappear. Such disappearance of carriers lowers the photosensitivity of a phototransistor.

SUMMARY OF THE INVENTION

In view of the above background art it is, an object of the present invention to improve the photosensitivity of a phototransistor including a heterojunction between a monocrystalline semiconductor and an amorphous semiconductor.

A phototransistor according to the present invention includes a monocrystalline semiconductor substrate of a first conductivity type, a crystalline semiconductor layer of a second conductivity type formed to a predetermined depth from a surface of the semiconductor substrate, a substantially intrinsic amorphous semiconductor layer formed on the crystalline semiconductor layer, and an amorphous semiconductor layer of the first conductivity type formed on the intrinsic amorphous semiconductor layer.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
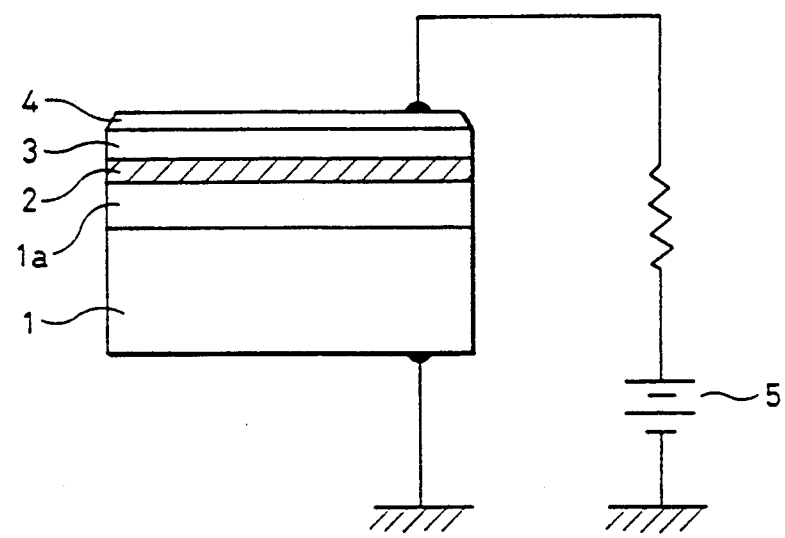
FIG. 1 is a diagram schematically illustrating a layered structure of a phototransistor according to an embodiment of the present invention.

Referring to FIG. 1, a structure of stacked layers in a phototransistor according to an embodiment of the present invention and the electrical connections for driving the phototransistor are schematically illustrated. This phototransistor includes a monocrystalline silicon substrate 1 of a $p^+$ type having a low resistance. A crystalline silicon layer 1a of an n type and having a high resistance is formed on an upper surface of the monocrystalline substrate 1 to a predetermined layer depth by a normal diffusion method. A substantially intrinsic (i-type) amorphous silicon layer 2, which is not included in a conventional phototransistor, is deposited on the monocrystalline silicon layer 1a by a known plasma CVD method. An amorphous silicon layer 3 of a p-type is deposited on the substantially intrinsic amorphous silicon layer 2. A transparent electrode layer 4 is deposited on p-type amorphous silicon layer 3 for receiving light the transparent electrode 4 can be made of tin oxide or/and indium tin oxide.

In the structure of the phototransistor in FIG. 1 the, $p^+$-type monocrystalline silicon substrate 1 the, n-type crystalline silicon layer 1a, and the p-type amorphous silicon layer 3 function as a collector, a base, and an emitter, respectively. Although the $p^+$-type monocrystalline silicon substrate 1 has low resistance and therefore serves not only as a collector but also as an electrode in the phototransistor of FIG. 1, it is also possible to form an additional electrode layer of metal on an upper surface of silicon substrate 1.

Generally, there is a tendency for an amorphous silicon layer, which is deposited without doping conductivity type determining impurities, to show a rather n-type conductivity. Such a rather n-type amorphous silicon layer and an amorphous silicon layer which is made just intrinsic by doping an extremely small amount of p-type impurities, may be used as a substantially intrinsic amorphous silicon layer 2 in FIG. 1. The substantially intrinsic amorphous silicon layer can be formed with a satisfactory film quality and includes less localized energy levels as compared with a conductive type amorphous silicon layer.

In the phototransistor of FIG. 1, a positive potential and a negative potential are applied from a voltage source 5 to the emitter of the p-type amorphous silicon layer 3 and to the collector of the p+-type monocrystalline silicon substrate 1, respectively.

Figure 2A:
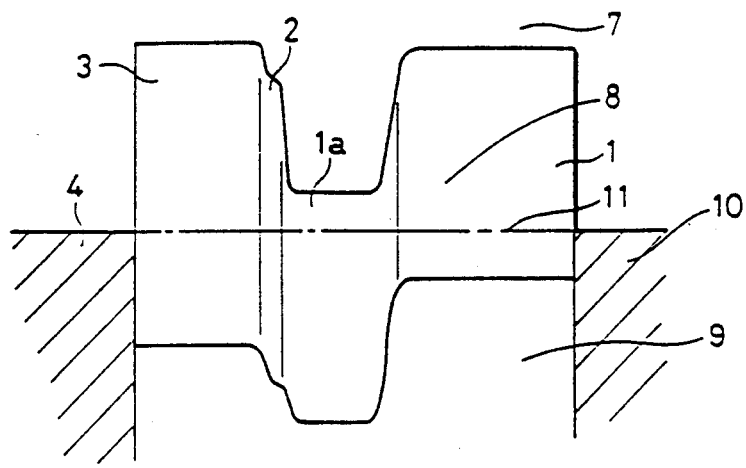
FIGS. 2A, 2B and 2C are diagrams illustrating a structure of an energy band in the phototransistor in FIG. 1.
Figure 2B:
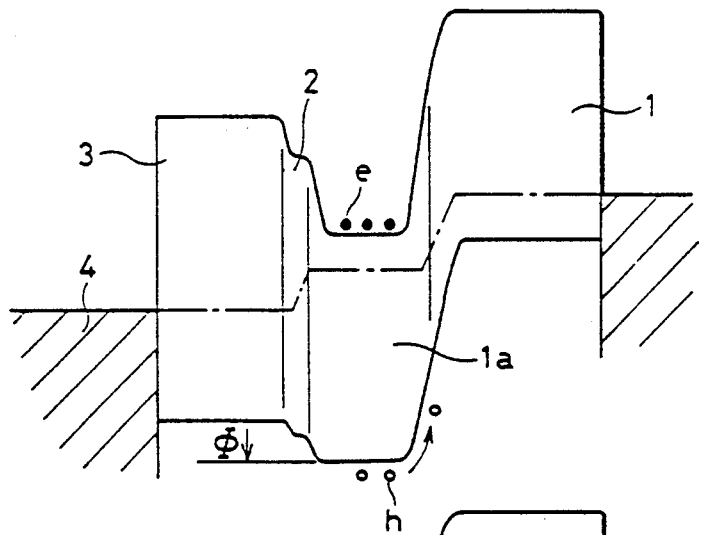
Figure 2C:
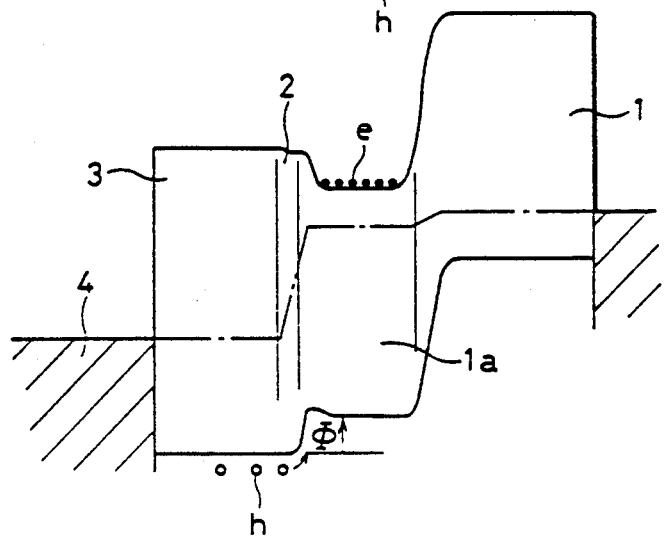

It facilitates understanding the operation of the phototransistor of FIG. 1 by referring to changes in the structure of the energy band illustrated in FIGS. 2A, 2B and 2C. In FIGS. 2A-2C, the vertical direction corresponds to the potential energy of the electrons, and the horizontal direction corresponds to the position of the constituent layers in the phototransistor of FIG. 1. Regions in the horizontal direction indicated by reference numerals 1, 1a, 2, 3 and 4 in FIGS. 2A-2C correspond to the constituent layers indicated by the same reference numerals in the phototransistor in FIG. 1. Regions of a vertical direction indicated by reference numerals 7, 8 and 9 represent a conduction band, a forbidden band, and a valence band, respectively. A region indicated by reference numeral 10 represents a conductor connected to silicon substrate 1, and numeral 11 represents a Fermi energy level.

FIG. 2A shows a structure of an energy band in a phototransistor having the collector 1 and the emitter 4 shortcircuited in a state in which the phototransistor not irradiated by light the (hereinafter referred to as a dark state). FIG. 2B shows a structure of an energy band in a case where a bias voltage 5 of FIG. 1 is applied in the dark state. FIG. 2C shows a structure of an energy band in a state in which the phototransistor is irradiated by light and a bias voltage is applied to the phototransistor by the source 5 to the respective transistor terminals shown in FIG. 1.

As will be understood from FIGS. 1 and 2B, the voltage applied by the voltage source 5 functions as a reverse bias voltage with respect to the collector 1 and the base 1a, so that, in the dark state, the phototransistor is in OFF state, letting almost no electric current pass through it. When the phototransistor is irradiated by light in a state in which the reverse bias voltage is applied, holes "h" out of charge carriers generated in the base 1 are diffused into the collector 1, while electrons "e" are accumulated in a potential well between the collector 1 and the emitter 3. The accumulated electrons "e" function to raise the potential energy in the base 1a as illustrated in FIG. 2C. As a result, the height Φ of a barrier to the holes between the base 1 and the emitter 3 is reduced, and movement of holes from the emitter 3 to the base 1a becomes easy, and the phototransistor is turned on. Specifically, when the phototransistor of FIG. 1 is irradiated by light an electric current flows from the emitter 3 through the base 1a to the collector 1 due to the hole movements, in addition to the electric current caused by the charge carriers generated in the base 1a, and as a result it is possible to sense light irradiation.

However, in the conventional phototransistor the, intrinsic amorphous silicon layer 2 is not included between the base 1a and the emitter 3, and the p-type amorphous silicon layer 3 including a number of localized energy levels is joined directly to the crystalline base layer 1a, so that there are a number of interface energy levels at the junction interface. Accordingly, even if the structure of the energy band of the phototransistor is changed into a structure through which electric current can be passed by light irradiation, there is a tendency for the number of interface energy levels at the junction interface between emitter 3 and base 1a to trap or recombine charge carriers moving thereto and to make them disappear. Trapping and recombining those carriers lowers the photosensitivity of the phototransistor.

On the other hand, in the phototransistor of this invention embodiment, the substantially intrinsic amorphous silicon layer 2 including less localized energy levels as compared with those of a conductive amorphous silicon layer is interposed between the p-type amorphous silicon layer 3 and the crystalline base layer 1a, so that the interface energy levels are decreased, and it is possible to suppress the disappearance of the charge carriers. Particularly, it is possible to suppress the disappearance of electrons generated in the base layer 1a by light irradiation and accumulate the electrons to effectively raise the potential level in the bas layer 1a. Hence, the present phototransistor is turned on even by a small amount of light irradiation, and therefore light irradiation can be sensed with a high sensitivity. The photosensitivity of the phototransistor of this invention embodiment can be improved to be about 1.5 times of that of a conventional phototransistor with respect to light having a wavelength of 500nm and to be about 1.2 times of that of a conventional phototransistor with respect to light having a wavelength of 450nm.

Although the intrinsic amorphous silicon layer 2 improves the interface characteristics of semiconductor junction, the intrinsic layer 2 itself also has a tendency to absorb light, so that there is a preferable range of the thickness of the intrinsic layer 2 for improving the photosensitivity of the present phototransistor.

Figure 3:
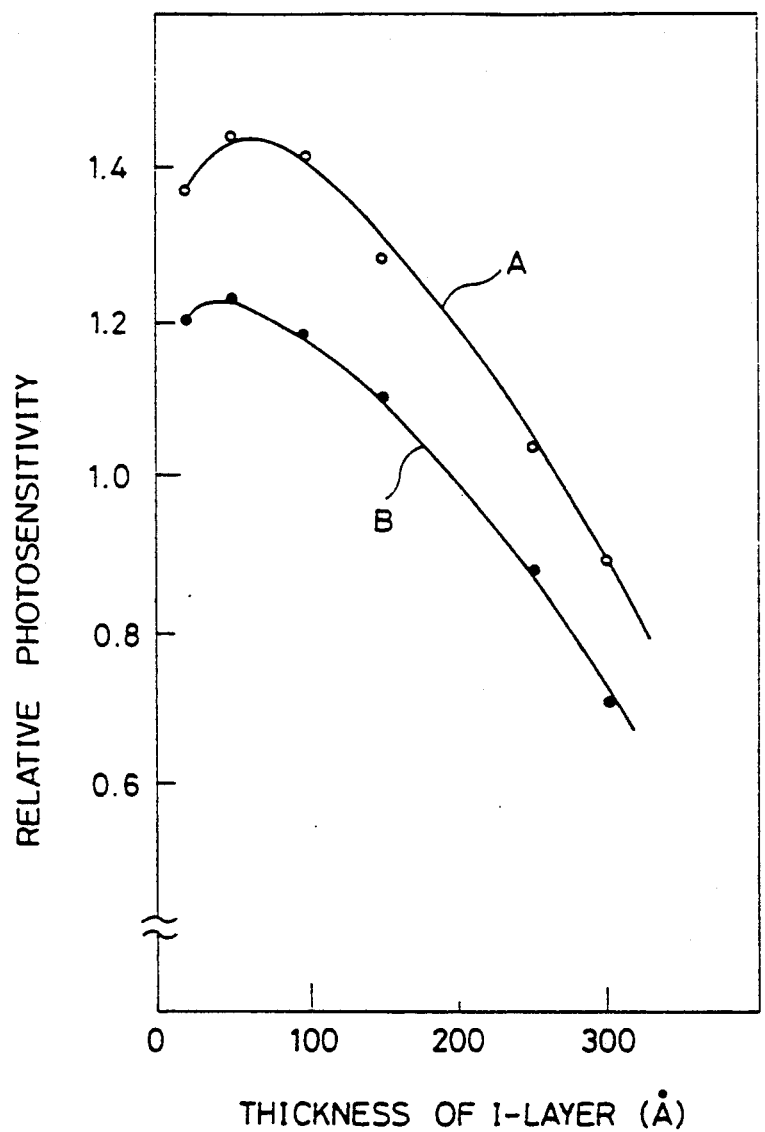
FIG. 3 is a graph showing the relation between the thickness of an intrinsic amorphous semiconductor layer and the photosensitivity of a phototransistor including the intrinsic amorphous semiconductor layer.

Referring to the graph of FIG. 3, the relation between the thickness of the intrinsic amorphous silicon layer 2 and the photosensitivity of a phototransistor is illustrated. In this graph, the abscissa indicates the thickness of intrinsic layer 2, and the ordinate indicates the relative photosensitivity. Curves A and B show the relation between the photosensitivity and the thickness of the intrinsic layer 2 with respect to light having a wavelength of 500nm and light having a wavelength of 450nm, respectively. As seen from FIG. 3, the peak of the photosensitivity of the phototransistor exists approximately in a range of 50Å to 100Å, although it depends on the wavelength of the irradiating light. In addition, it is preferable that the thickness of the intrinsic layer 2 is within the range of about 10Å to about 300Å in order to obtain a phototransistor having an improved photosensitivity as compared with a conventional phototransistor.

Although a phototransistor including a pnp junction has been described in the embodiment in FIG. 1, it will be readily understood by those skilled in the art that it is also possible to apply the present invention to a phototransistor including an npn junction.

In addition, although a phototransistor including amorphous silicon has been described in the above embodiment, it will be readily understood by those skilled in the art that it is also possible to utilize other amorphous semiconductors such as amorphous silicon carbide, amorphous silicon germanium, amorphous silicon-tin, or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phototransistor, comprising: a monocrystalline semiconductor substrate of a first conductivity type forming a collector of said phototransistor; a crystalline semiconductor layer of a second conductivity type forming a base formed in a surface of said semiconductor substrate to a predetermined depth; a substantially intrinsic amorphous semiconductor layer having a layer thickness within the range of 10Å to 300Å formed on said crystalline semiconductor layer for decreasing interface energy levels, whereby a disappearance of charge carriers is suppressed for an improved light sensitivity; an amorphous semiconductor layer of the first conductivity type forming an emitter capable of receiving light and formed on said substantially intrinsic amorphous semiconductor layer; and at least two terminals, one of which is connected to said collector and the other is connected to said emitter for driving said phototransistor.

2. The phototransistor according to claim 1, wherein said substantially intrinsic amorphous semiconductor layer has a thickness within the range of 50Å–100Å.

3. The phototransistor according to claim 1, wherein a transparent electrode layer is formed on said amorphous semiconductor layer of the first conductivity type, said transparent electrode having connected thereto said other of said terminals.

* * * * *